United States Patent [19]
Kanai

[11] Patent Number: 5,216,673
[45] Date of Patent: Jun. 1, 1993

[54] SEMICONDUCTOR MEMORY TESTER
[75] Inventor: Junichi Kanai, Hanyu, Japan
[73] Assignee: Advantest Corporation, Tokyo, Japan
[21] Appl. No.: 637,323
[22] Filed: Jan. 3, 1991
[30] Foreign Application Priority Data
  Jan. 10, 1990 [JP]  Japan ................................ 2-4095
[51] Int. Cl.[5] ...................... G01R 31/28; G11C 29/00
[52] U.S. Cl. .................................................. 371/21.2
[58] Field of Search ...................... 371/21.2, 21.6, 25.1

[56]         References Cited
       U.S. PATENT DOCUMENTS

| 4,627,053 | 12/1986 | Yamaki et al. | 371/21.6 X |
| 4,860,259 | 8/1989 | Tobita | 371/21.2 X |
| 5,025,205 | 6/1991 | Mydill et al. | 371/25.1 X |

FOREIGN PATENT DOCUMENTS 0218830 4/1987 European Pat. Off. .
0268789 6/1988 European Pat. Off. .

OTHER PUBLICATIONS

M. W. Schraeder, "Multiplexed measuring devices reduce in-circuit-test expenses", May. 12, 1982, 2119 E.D.N. Electrical Design News, vol. 27 pp. 187–190, Boston, Mass.

Primary Examiner—Stephen M. Baker
Attorney, Agent, or Firm—Staas & Halsey

[57]             ABSTRACT

In a semiconductor memory tester in which a test pattern from a pattern generator is applied to a plurality of memory devices installed on a test head and their outputs are each logically compared by a logical comparator with an expected value for each pin, there are provided a plurality of OR circuits each of which obtains the OR of the results of logical comparisons corresponding to predetermined plural pins of each memory device. A plurality of multiplexers, each of which is supplied with the results of logical comparisons for corresponding output pins of the plurality of memory devices and a different one of the plurality of OR outputs, are provided for each group of corresponding output pins and each selectively output any one of the plurality of results of logical comparisons and the OR input thereto in accordance with a select signal. The outputs of these multiplexers are distributed to and stored in a plurality of fail memories.

3 Claims, 8 Drawing Sheets

TABLE I

| | INPUTS | a | b | c | OUTPUT | 3rd MPX | |
|---|---|---|---|---|---|---|---|
| | | | | | | S = 0 | S = 1 |
| 1st MPX | A1₁, A2₁, A3₁ A4₁, ORA1 | 0 | 0 | 0 | A1₁ | SELECT 1st MPX | SELECT 2nd MPX |
| | | 1 | 0 | 0 | A2₁ | | |
| | | 0 | 1 | 0 | A3₁ | | |
| | | 1 | 1 | 0 | A4₁ | | |
| | | 0 | 0 | 1 | ORA1 | | |
| | INPUTS | a | b | c | OUTPUT | | |
| 2nd MPX | B1₁, B2₁, B3₁ B4₁, ORB1 | 0 | 0 | 0 | B1₁ | | |
| | | 1 | 0 | 0 | B2₁ | | |
| | | 0 | 1 | 0 | B3₁ | | |
| | | 1 | 1 | 0 | B4₁ | | |
| | | 0 | 0 | 1 | ORB1 | | |

SEMICONDUCTOR MEMORY TESTER

BACKGROUND OF THE INVENTION

The present invention relates to a semiconductor memory tester which has an arrangement in which a test pattern is applied to each of a plurality of memory devices under test mounted on a test head, the output from each memory device is subjected to a logical comparison with an expected value for each pin and the result of logical comparison is stored in a fail memory.

Figure 1:
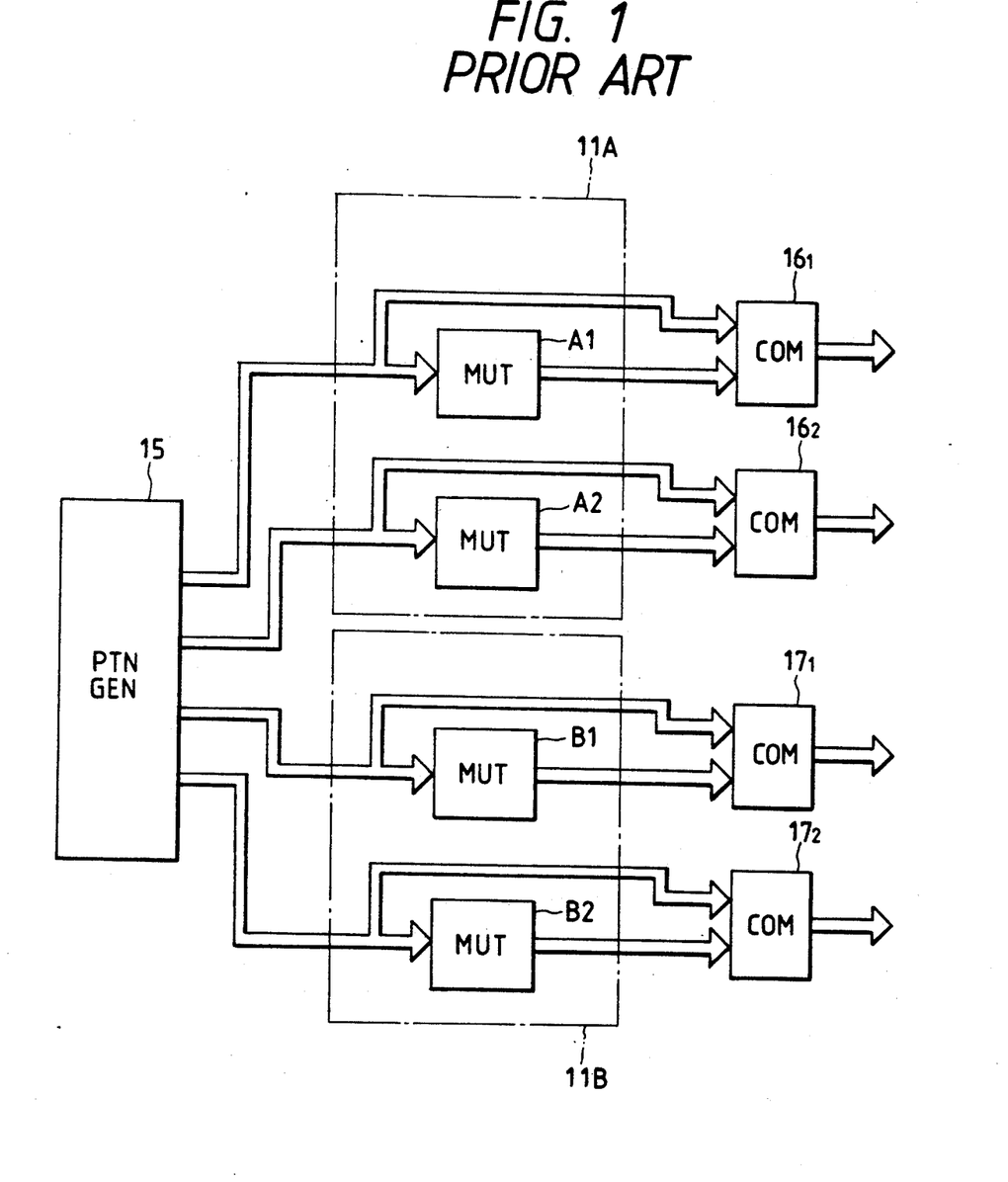
FIG. 1 is a block diagram showing a portion of a conventional memory tester.

FIG. 1 shows a portion of a semiconductor memory tester of this kind. Memory devices under test A1 and A2 are mounted on a first test head 11A and memory devices B1 and B2 are mounted on a second test head 11B. A test pattern, i.e. data and an address, from a pattern generator 15 is applied to the memory devices A1, A2, B1 and B2, in which the data is written at the address and from which the thus written data is read out into logical comparators $16_1$, $16_2$, $17_1$ and $17_2$ for comparison with expected values for each pin. The compared results are output from the comparators $16_1$, $16_2$, $17_1$ and $17_2$.

Figure 2:
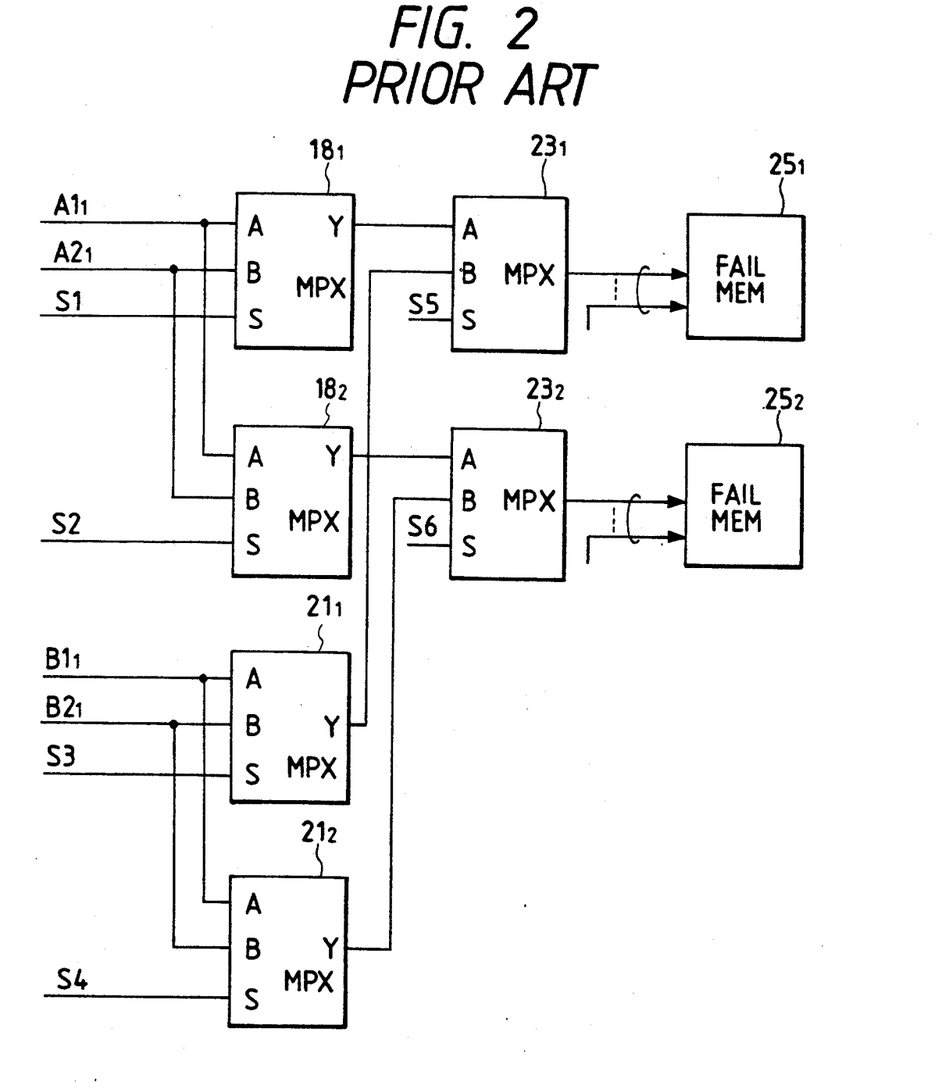
FIG. 2 is a block diagram showing multiplexers connected to test heads in the conventional memory tester.

Conventionally, these results of comparison are stored in fail memories in the following manner: as depicted in FIG. 2 in which the results of logical comparison for only first pins of the memory devices A1, A2, B1 and B2 are shown, compared outputs $A1_1$ and $A2_1$ for the first pins of the memory devices A1 and A2 on the first test head 11A are both applied to multiplexers $18_1$ and $18_2$. The multiplexer $18_1$ responds to a select signal $S_1$ to select and output one of the two inputs thereto, and the multiplexer $18_2$ similarly responds to a select signal $S_2$ to select and output one of the two inputs thereto. Likewise, the results of comparison $B1_1$ and $B2_1$ for the first pins of the memory devices B1 and B2 on the second test head 11B are both provided to multiplexers $21_1$ and $21_2$. The multiplexer $21_1$ responds to a select signal $S_3$ to select and output one of the two inputs thereto, and the multiplexer $21_2$ responds to a select signal $S_4$ to select and output one of the two inputs thereto. The outputs of the multiplexers $18_1$ and $21_1$ are input into a multiplexer $23_1$, which responds to a select signal $S_5$ to select and output one of the inputs. Similarly, the outputs of the multiplexers $18_2$ and $21_2$ are input into a multiplexer $23_2$, which responds to a select signal $S_6$ to select and output one of the inputs. The outputs of the multiplexers $23_1$ and $23_2$ are stored in fail memories $25_1$ and $25_2$, respectively.

As a result of this, for example, when the select signals $S_1$ and $S_5$ are both low, the comparison result $A1_1$ is stored in the fail memory $25_1$, and when the select signals $S_2$ and $S_6$ are high and low, respectively, the comparison result $B2_1$ is stored in the fail memory $25_2$. Also for handling results of logical comparisons of the memory devices A1, A2, B1 and B2 for other pins, there are provided multiplexers similar to those $18_1$, $18_2$, $21_1$, $21_2$, $23_1$ and $23_2$ though not shown, and the fail memories $25_1$ and $25_2$ are adapted to store at respective addresses the results of logical comparisons corresponding to respective pins.

In the case where only one of the test heads 11A and 11B, for example, 11A, is used, the results of logical comparisons for the two memory devices A1 and A2 loaded on the test head 11A can concurrently be stored in the fail memories $25_1$ and $25_2$. However, when the both test heads 11A and 11B are used, the following problems exist:

(a) Since the multiplexers $23_1$ and $23_2$ each select either one of the comparison results from the test heads 11A and 11B, all the comparison results for the memory devices A1, A2 and B1, B2 carried by the test heads 11A and 11B, respectively, cannot be output concurrently. In other words, the comparison result for only one of the memory devices, for example, A1 loaded on the test head 11A and the comparison result for only one of the memory devices, for example, B1 on the test head 11B are stored in the fail memories $25_1$ and $25_2$.

(b) If the comparison results for both of the memory devices, for instance, A1 and A2 on the one test head 11A are simultaneously stored in the fail memories $25_1$ and $25_2$, the comparison results for the both memory devices B1 and B2 on the other test head 11B cannot be stored in the fail memories $25_1$ and $25_2$.

SUMMARY OF THE INVENTION

It is therefore an object of the present invention to provide a semiconductor memory tester in which the results of tests of a plurality of semiconductor memory devices under test on a desired one of a plurality of test heads can selectively stored in a plurality of fail memories as in the prior art and in which, if necessary, the results of "good/no good" decision on all the memory devices under test can be stored in a desired fail memory for each test pattern.

According to the present invention, the results of logical comparisons for a predetermined plurality of pins of each of N (where N is an integer equal to or greater than 2) memory devices under test on a first test head are ORed by a first OR circuit, and the results of logical comparisons for a predetermined plurality of pins of each of N memory devices under test on a second test head are ORed by a second OR circuit. A desired one of N+1 outputs including the results of logical comparisons for the corresponding pins of the N memory devices on the first test head and the output of the first OR circuit, corresponding to one of the N memory devices, is selected by a first multiplexer. Similarly, a desired one of N+1 outputs including the results of logical comparisons for the corresponding pins of the N memory devices on the second test head and the output of the second OR circuit, corresponding to one of the N memory devices, is selected by a second multiplexer. One of the outputs of the first and second multiplexers for each of the corresponding pins is selected by one of third multiplexers, and the outputs of these third multiplexers are stored in a plurality of fail memories.

DESCRIPTION OF THE PREFERRED EMBODIMENTS

The present invention will hereinafter be described on the assumption that the afore-mentioned integer N is four.

Figure 3:
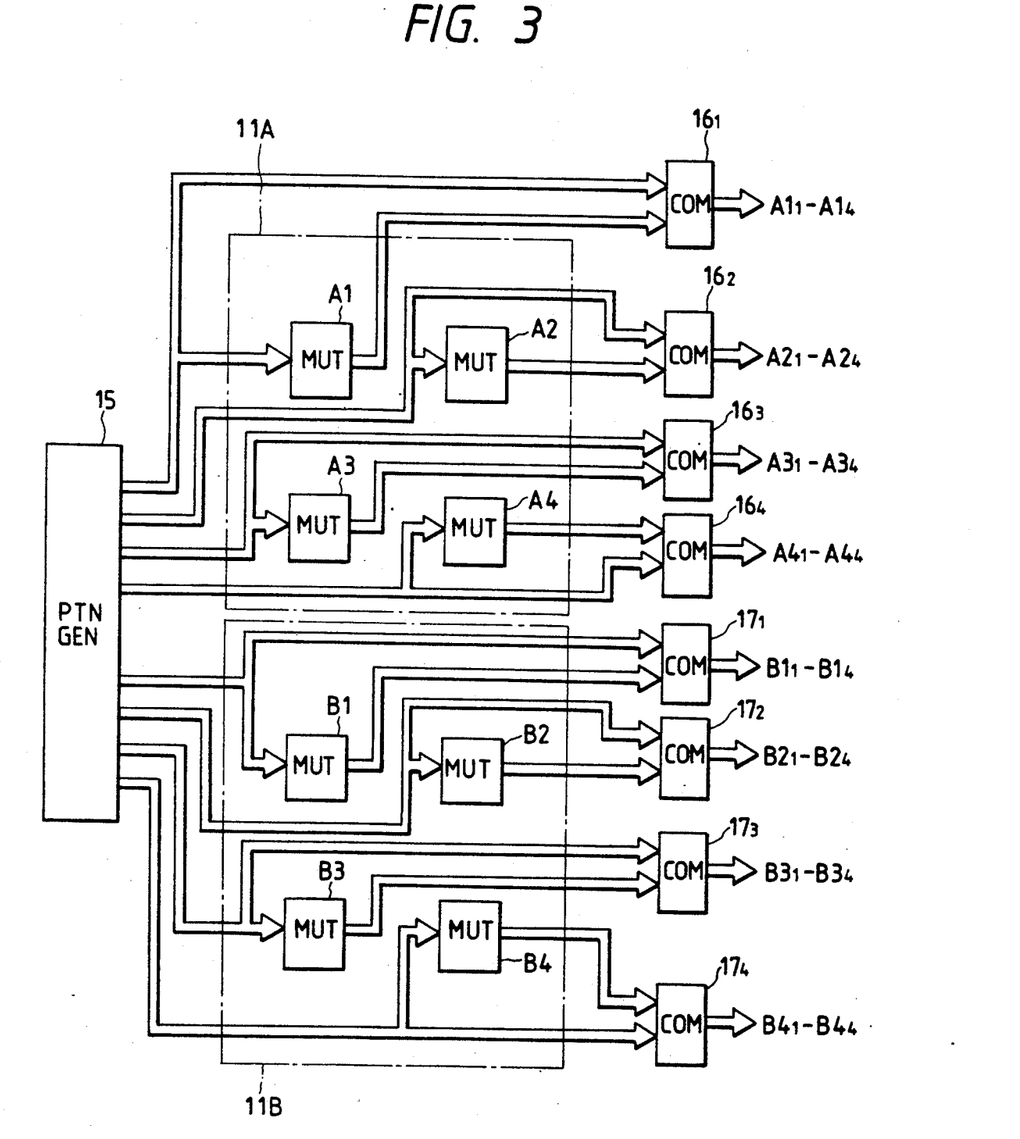
FIG. 3 is a block diagram illustrating a portion of a memory tester embodying the present invention.

As shown in FIG. 3, the first test head 11A carries four memory devices under test A1 to A4 and the second test head 11B carries four memory devices under test B1 to B4. A test pattern composed of data and an address is applied from the pattern generator 15 to the memory devices A1 to A4 and B1 to B4, wherein the data is written at the address. The data thus written in the memory devices under test is read out therefrom and provided to logical comparators $16_1$ to $16_4$ and $17_1$ to $17_4$ for logical comparison with expected values for each pin. The results of such logical comparisons are stored in fail memories. In this embodiment the memory devices A1 to A4 and B1 to B4 each have four output pins and the results of logical comparisons $A1_1$ to $A1_4$, $A2_1$ to $A2_4$, $A3_1$ to $A3_4$, $A4_1$ to $A4_4$ and $B1_1$ to $B1_4$, $B2_1$ to $B2_4$, $B3_1$ to $B3_4$, $B4_1$ to $B4_4$ are selectively stored in the fail memories as described below.

Figures 4, 4A:
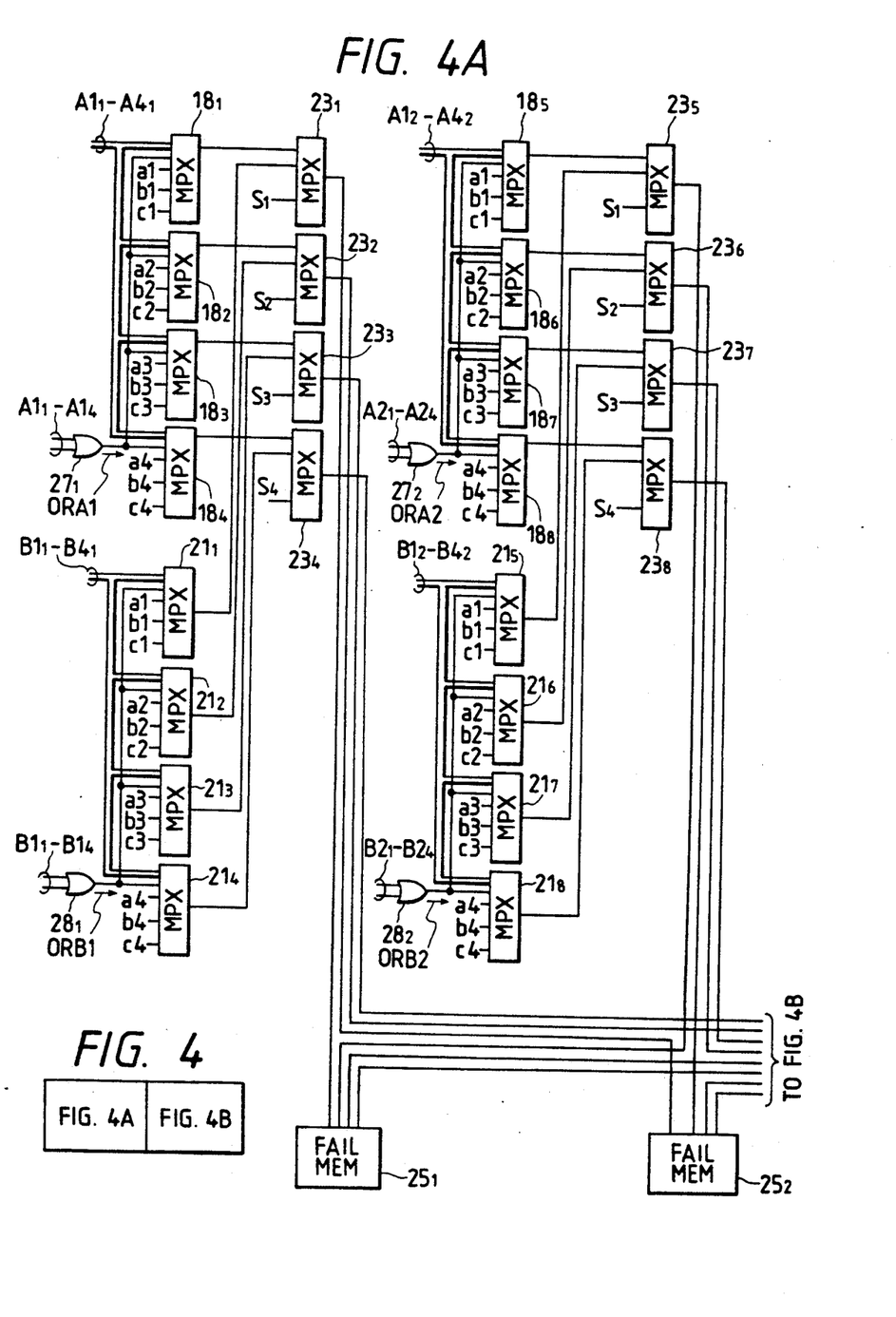
FIGS. 4, 4A, and 4B are block diagrams showing the entire multiplexer circuitry used in the memory tester of the present invention.
Figure 4B:
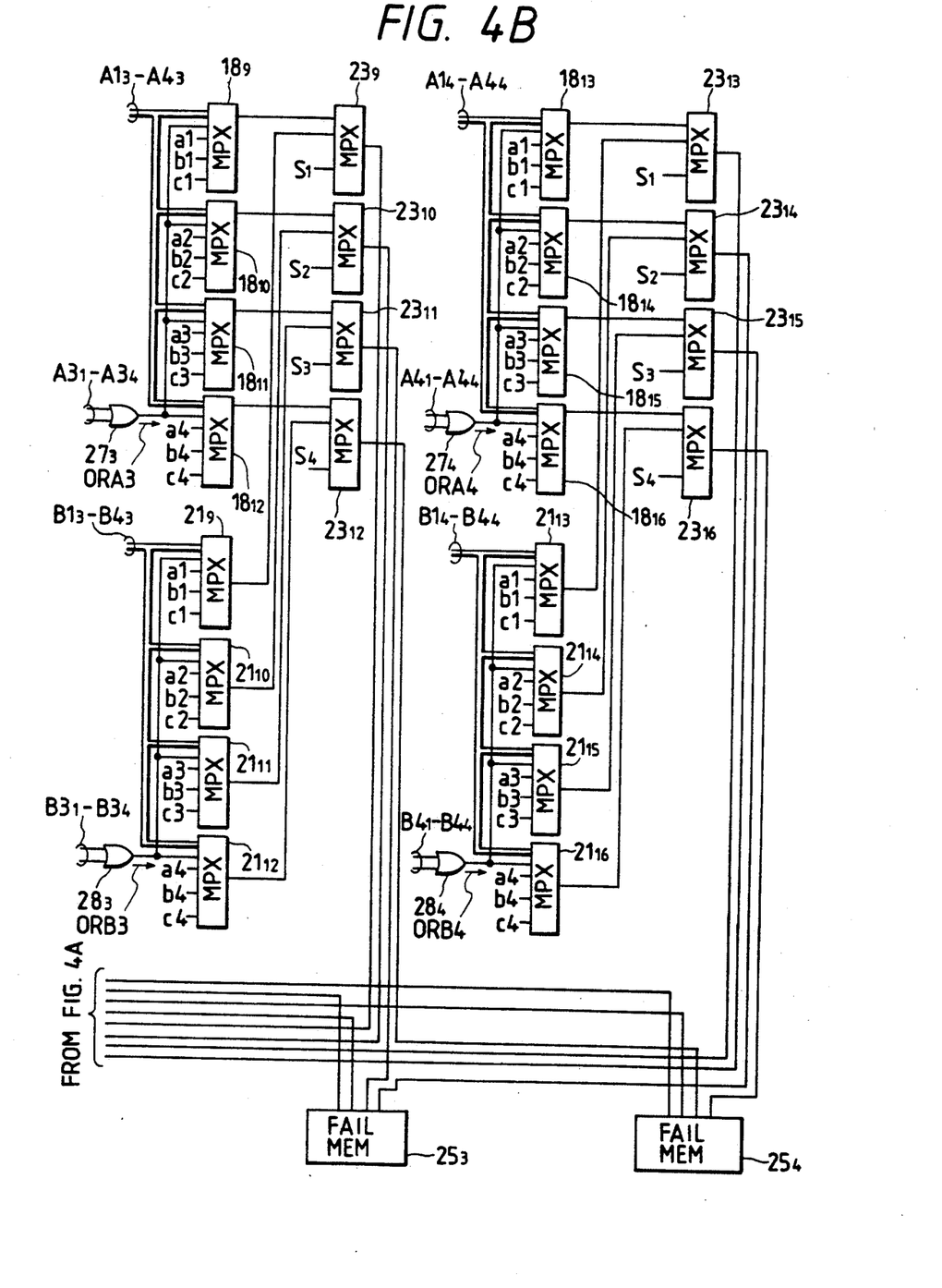

FIG. 4 illustrates an example of a multiplexer circuit constructed so that the results of logical comparisons output from the logical comparators $16_1$ to $16_4$ and $17_1$ to $17_4$ in FIG. 3 can selectively be stored in fail memories $25_1$ to $25_4$ as in the prior art and that, if necessary, the logical sums (i.e. logical OR's) of the results of logical comparisons corresponding to the plurality of pins of the memory devices can selectively stored in the fail memories $25_1$ to $25_4$ according to the present invention.

In FIG. 4, first multiplexers $18_1$ to $18_4$ are supplied with the results of logical comparisons $A1_1$, $A2_1$, $A3_1$ and $A4_1$ corresponding to first pins of the memory devices A1 to A4 loaded on the first test head 11A depicted in FIG. 3, respectively. The results of logical comparisons $A1_1$, $A1_2$, $A1_3$ and $A1_4$ corresponding to the four output pins of the memory device A1 are ORed by a first OR circuit $27_1$ and the resulting logical sum ORA1 is also provided to the multiplexers $18_1$ to $18_4$. Based on select signals a1, b1 and c1 applied thereto, the first multiplexer $18_1$ selects and outputs any one of the four results of logical comparisons $A1_1$ to $A4_1$ and the logical sum ORA1. The first multiplexers $18_2$, $18_3$ and $18_4$ each select and output any one of the four results of logical comparisons $A1_1$ to $A4_1$ and the logical sum ORA1, based on the select signals (a2, b2, c2), (a3, b3, c3) and (a4, b4, c4), respectively. Similarly, first multiplexers $18_5$ to $18_8$ are each supplied with the results of logical comparisons $A1_2$, $A2_2$, $A3_2$ and $A4_2$ corresponding to second output pins of the memory devices A1 to A4 and a logical sum ORA2 of the results of logical comparisons corresponding to the four output pins of the memory device A2 and provided from a first OR circuit $27_2$, and one of the five inputs to each of the first multiplexers $18_5$ to $18_8$ is selected and output therefrom in accordance with the select signals (a1, b1, c1), (a2, b2, c2), (a3, b3, c3) and (a4, b4, c4), respectively. First multiplexers $18_9$ to $18_{12}$ are each supplied with the results of logical comparisons $A1_3$, $A2_3$, $A3_3$ and $A4_3$ corresponding to third output pins of the memory devices A1 to A4 and a logical sum ORA3 of the results of logical comparisons corresponding to the four output pins of the memory device A3 and provided from a first OR circuit $27_3$, and one of the five inputs to each of the first multiplexers $18_9$ to $18_{12}$ is selected and output. First multiplexers $18_{13}$ to $18_{16}$ are each supplied with the results of logical comparisons $A1_4$, $A2_4$, $A3_4$ and $A4_4$ corresponding to fourth output pins of the memory devices A1 to A4 and a logical sum ORA4 of the results of logical comparisons corresponding to the four output pins of the memory device A4 provided from a first OR circuit $27_4$, and the first multiplexers $18_{13}$ to $18_{16}$ each selectively output one of such five inputs thereto in the same manner as referred to above.

Likewise, four groups of second multiplexers $21_1$ to $21_4$, $21_5$ to $21_8$, $21_9$ to $21_{12}$ and $21_{13}$ to $21_{16}$ are supplied with the results of logical comparisons $B1_1$ to $B4_1$, $B1_2$ to $B4_2$, $B1_3$ to $B4_3$ and $B1_4$ to $B4_4$ for the corresponding output pins of the memory devices B1 to B4 loaded on the test head 11B and logical sums ORB1 to ORB4 of the results of logical comparisons corresponding to the four output pins of each of the memory devices B1 to B4 provided from second OR circuits $28_1$ to $28_4$, respectively. The second multiplexers each selectively output one of such five inputs thereto.

A third multiplexer $23_1$ is supplied with the selected outputs from the first multiplexer $18_1$ associated with the first test head 11A and the second multiplexer $21_1$ associated with the second test head 11B and selectively outputs one of the two inputs in accordance with the select signal $S_1$. A third multiplexer $23_2$ is supplied with the selected outputs from the first and second multiplexers $18_2$ and $21_2$ and selectively outputs either one of the two inputs in accordance with the select signal $S_2$. A third multiplexer $23_3$ is supplied with the selected outputs from the first and second multiplexers $18_3$ and $21_3$ and selectively outputs either one of the two inputs in accordance with a select signal $S_3$. A third multiplexer $23_4$ is supplied with the selected outputs from the first and second multiplexers $18_4$ and $21_4$ and selectively outputs either one of the two inputs in accordance with a select signal $S_4$. Similarly, each of third multiplexers $23_5$ to $23_8$, $23_9$ to $23_{12}$ and $23_{13}$ to $23_{16}$ is also supplied with the Selected outputs from the first and second multiplexers associated with the first and second test heads 11A and 11B, respectively, and selectively outputs either one of the two inputs in accordance with corresponding one of select signals $S_1$ to $S_4$.

The selected outputs from the third multiplexers $23_1$ to $23_4$ are provided as first bit inputs to fail memories $25_1$ to $25_4$; the selected outputs from the third multiplexers $23_5$ to $23_8$ are provided as second bit inputs to the fail memories $25_1$ to $25_4$; the selected outputs from the third multiplexers $23_9$ to $23_{12}$ are provided as third bit inputs to the fail memories $25_1$ to $25_4$; and the selected outputs from the third multiplexers $23_{12}$ to $23_{16}$ are provided as fourth bit inputs to the fail memories $25_1$ to $25_4$.

Figure 5:
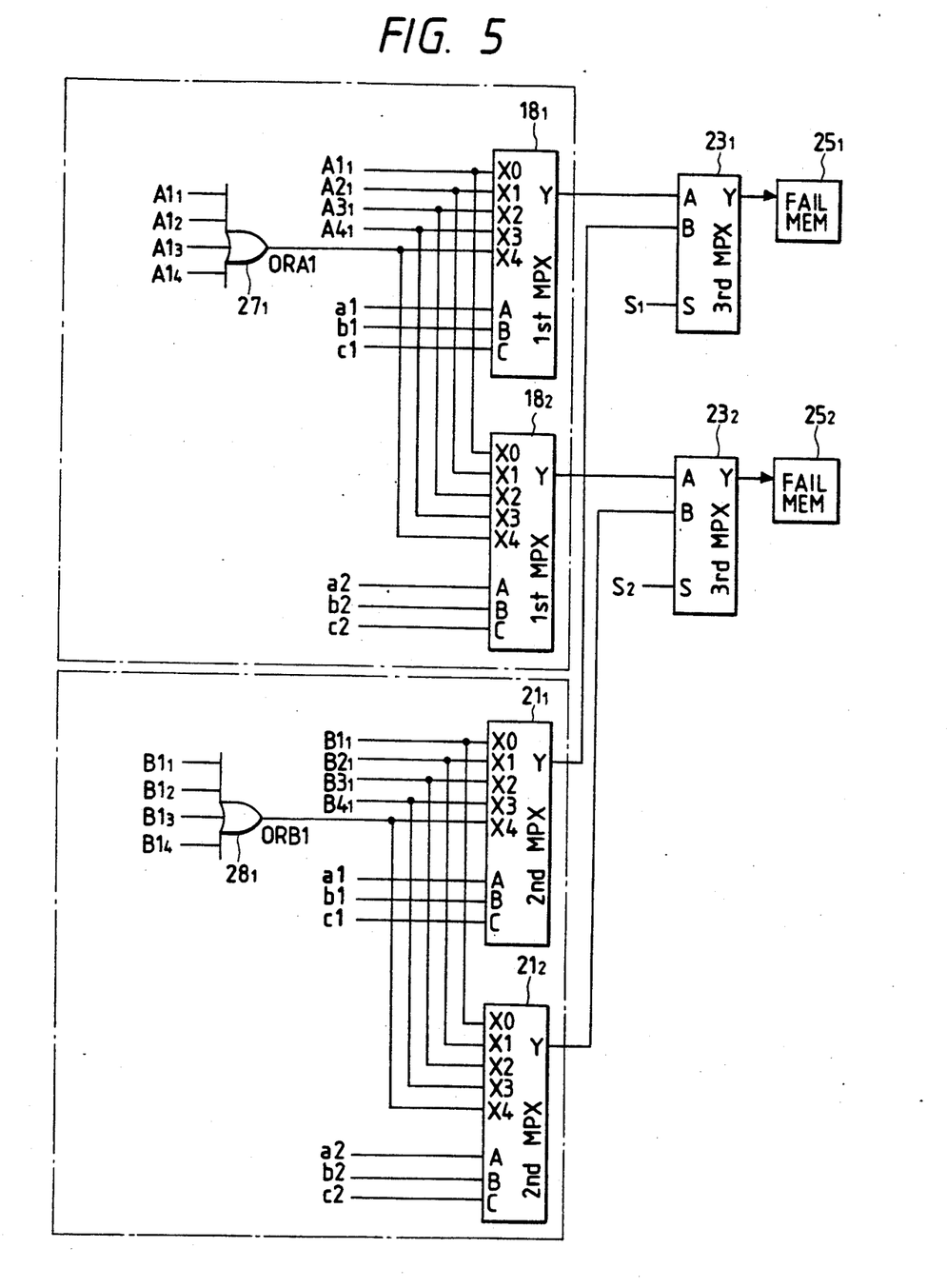
FIG. 5 is a circuit diagram showing in detail a portion of the multiplexer circuitry depicted in FIG. 4.
Figure 6:
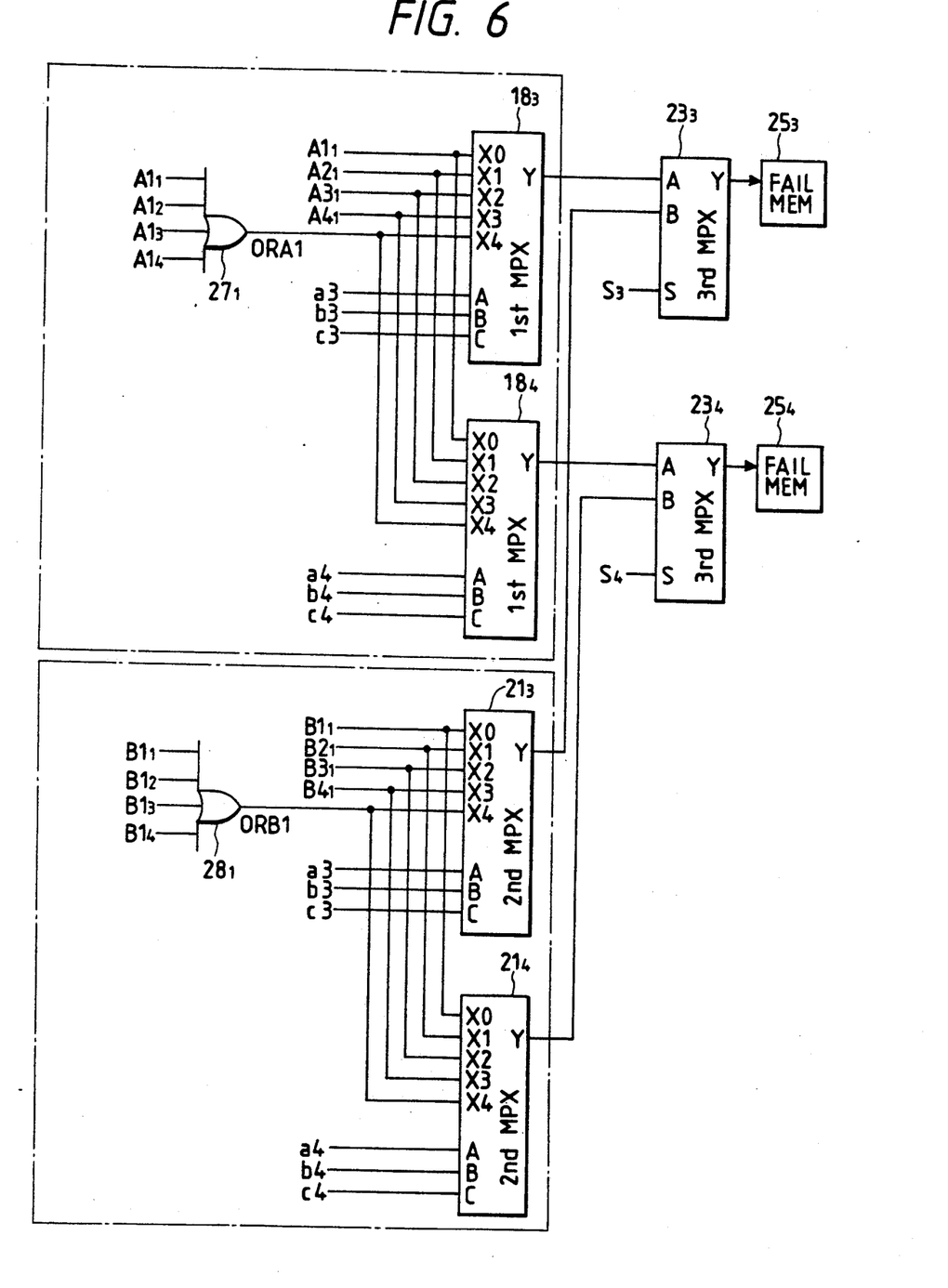
FIG. 6 is a circuit diagram showing in detail another portion of the multiplexer circuitry depicted in FIG. 4.

FIGS. 5 and 6 show concrete circuits interconnecting the OR circuits $27_1$ and $28_1$, the first multiplexers $18_1$ to $18_4$, the second multiplexers $21_1$ to $21_4$, the third multiplexers $23_1$ to $23_4$ and the fail memories $25_1$ to $25_4$ in FIG. 4. For convenience of description there are shown also in FIG. 6 the same OR circuits $27_1$ and $28_1$ as those depicted in FIG. 5.

As shown in FIGS. 5 and 6, the results of logical comparisons $A1_1$ to $A4_1$ corresponding to the first output pins of the memory devices $12_1$ to $12_4$ carried by the first test head 11A are input into the first multiplexers $18_1$, $18_2$, $18_3$ and $18_4$, respectively. The results of logical comparisons $A1_1$ to $A1_4$ corresponding to the first to fourth output pins of the first memory device $12_1$ mounted on the first test head 11A are ORed by the first OR circuit $27_1$ and its output ORA1 is applied to each of the first multiplexers $18_1$ to $18_4$. The first multiplexer $18_1$ responds to the select signals a1 and b1 to select and output any one of the inputs $A1_1$ to $A4_1$ and, when the select signal c1 is high, outputs the output ORA1 from the first OR circuit $27_1$. The first multiplexer $18_2$ responds to the select signals a2 and b2 to select and output any one of the inputs $A1_1$ to $A4_1$ and, when the select signal c2 is high, outputs the output ORA1 from the first OR circuit $27_1$. The first multiplexer $18_3$ responds to the select signals a3 and b3 to select and output any one of the inputs $A1_1$ to $A4_1$ and, when the select signal c3 is high, outputs the output ORA1 from the first OR circuit $27_1$. The first multiplexer $18_4$ responds to the select signals a4 and b4 to select and output any one of the inputs $A1_1$ to $A4_1$ and, when the select signal c4 is high, outputs the output ORA1 from the first OR circuit $27_1$.

The results of logical comparisons $B1_1$ to $B4_1$ corresponding to the first output pins of the memory devices $14_1$ to $14_4$ carried by the second test head 11B are input into the second multiplexers $21_1$, $21_2$, $21_3$ and $21_4$, respectively. The results of logical comparisons corresponding to the first to fourth output pins of the memory device $14_1$ mounted on the second test head first memory device $14_1$ mounted on the second test head 11B are ORed by the second OR circuit $28_1$ and its output ORB1 is applied to each of the second multiplexers $21_1$ to $21_4$. As is the case with the first multiplexers $18_1$ to $18_4$, the second multiplexers $21_1$ to $21_4$ each selectively output any one of the five inputs in accordance with the select signals (a1, b1, c1), ... (a4, b4, c4).

The outputs of the first and second multiplexers $18_1$ and $21_1$ are input into the third multiplexer $23_1$ and either one of the two inputs is selectively output therefrom in accordance with the select signal $S_1$; the outputs of the first and second multiplexers $18_2$ and $21_2$ are input into the third multiplexer $23_2$ and either one of the two inputs is selectively output therefrom in accordance with the select signal $S_2$; the outputs of the first and second multiplexers $18_3$ and $21_3$ are input into the third multiplexer $23_3$ and either one of the two inputs is selectively output therefrom in accordance with the select signal $S_3$; and the outputs of the first and second multiplexers $18_4$ and $21_4$ are input into the third multiplexer $23_4$ and either one of the two inputs is selectively output therefrom in accordance with the select signal $S_4$. The outputs of the third multiplexers $23_1$ to $23_4$ are stored in the fail memories $25_1$ and $25_4$, respectively.

The connections of the first multiplexers $18_5$ to $18_8$, the second multiplexers $21_5$ to $21_8$ and the third multiplexers $23_5$ to $23_8$ in FIG. 4 are similar to those shown in FIGS. 5 and 6. Further, the first multiplexers $18_9$ to $18_{12}$, the second multiplexers $21_9$ to $21_{12}$, the third multiplexers $23_9$ to $23_{12}$ and the first multiplexers $18_{13}$ to $18_{16}$, the Second multiplexers $21_{13}$ to $21_{16}$, the third multiplexers $23_{13}$ to $23_{16}$ are also connected in a manner Similar to those shown in FIGS. 5 and 6. Hence, these circuit connections are not shown, for the sake of brevity.

Figure 7:
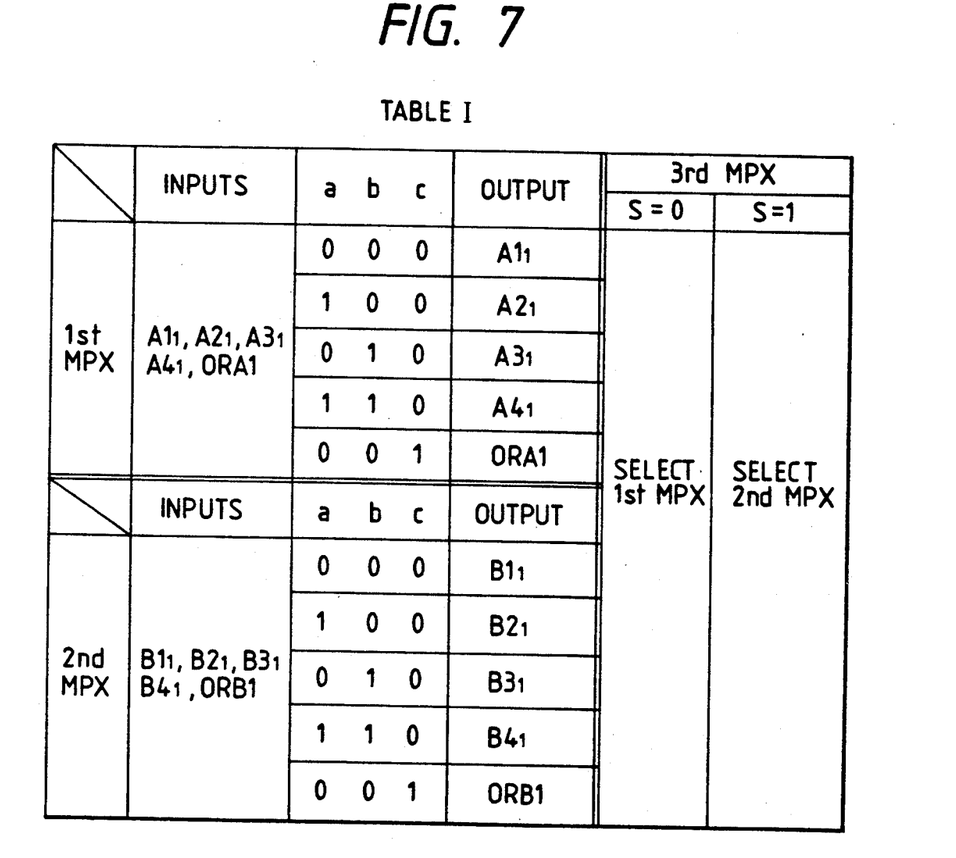
FIG. 7 is a table showing selective outputs corresponding to typical select signals of multiplexers in the multiplexer circuitry in FIG. 5.

Table I in FIG. 7 shows, by way of example, the selected outputs of the first and second multiplexers $18_1$ to $18_4$ and $21_1$ to $21_4$ and the selection of the third multiplexers $23_1$ to $23_4$ in response to the application thereto of the select signals identified by a, b, c and S. A horizontal column labeled "1st MPX" shows the five inputs $A1_1$ to $A4_1$ and ORA1 to the first multiplexers $18_1$ to $18_4$ associated with the first test head 11A and selected outputs corresponding to combinations of the select signals (a, b, c). Another horizontal column labeled "2nd MPX" shows the five inputs $B1_1$ to $B4_1$ and ORB1 to the second multiplexers $21_1$ to $21_4$ associated with the second test head 11B and selected outputs corresponding to combinations of the select signals (a, b, c). A vertical column labeled "3rd MPX" shows the multiplexer outputs which the third multiplexers $23_1$ to $23_4$ select in accordance with the select signal S.

Also in connection with the groups of first multiplexers $18_5$ to $18_8$, $18_9$ to $18_{12}$, $18_{13}$ to $18_{16}$, the groups of second multiplexers $21_5$ to $21_8$, $21_9$ to $21_{12}$, $21_{13}$ to $21_{16}$ and the groups of third multiplexers $23_5$ to $23_8$, $23_9$ to $23_{12}$, $23_{13}$ to $23_{16}$, the selected outputs based on the select Signals a, b, c and S can easily be determined in the same manner as described above in respect of Table I. Hence, such selected outputs are not shown.

Now, let it be assumed that the select signals are as follows: a1=0, b1=0, c1=0, a2=1, b2=0, c2=0, a3=0, b3=1, c3=0, a4=1, b4=1, c4=0, $S_1$=0, $S_2$=0, $S_3$=0, $S_4$=0. In the first multiplexers 181, 182, $18_3$ and $18_4$ the outputs $A1_1$, $A2_1$, $A3_1$ and $A4_1$ are selected, respectively; in the first multiplexers $18_5$, $18_6$, $18_7$ and $18_8$ the outputs $A1_2$, $A2_2$, $A3_2$ and $A4_2$ are selected, respectively; in the first multiplexers $18_9$, $18_{10}$, $18_{11}$ and $18_{12}$ the outputs $A1_3$, $A2_3$, $A3_3$ and $A4_3$ are selected, respectively; and in the first multiplexers $18_{13}$, $18_{14}$, $18_{15}$ and $18_{16}$ the outputs $A1_4$, $A2_4$, $A3_4$ and $A4_4$ are selected, respectively. Furthermore, since the third multiplexers $23_1$ to $23_{16}$ all select the first test head 11 side (the first multiplexer outputs), the results of logical comparisons $A1_1$ to $A1_4$ of the memory device $12_1$ are stored in the fail memory $25_1$; the results of logical comparisons $A2_1$ to $A2_4$ of the memory device $12_2$ are stored in the fail memory $25_2$; the results of logical comparisons $A3_1$ to $A3_4$ of the memory device $12_3$ are stored in the fail memory $25_3$; and the results of logical comparisons $A4_1$ to $A4_4$ of the memory device $12_4$ are stored in the fail memory $25_4$. In other words, the results of logical comparisons of the memory devices $12_1$ to $12_4$ are stored individually in the fail memories $25_1$ to $25_4$.

In the case where the select signals (a1, b1, c1), ... (a4, b4, c4) for the second multiplexers $21_1$ to $21_{16}$ have the same values as in the above case and the select signals $S_1$, $S_2$, $S_3$ and $S_4$ are all set to 1, the third multiplexers $23_1$ to $23_{16}$ select the second test head 11B side (the second multiplexer outputs), and consequently, the results of logical comparisons $B1_1$ to $B1_4$ of the memory device $14_1$, the results of logical comparisons $B2_1$ to $B2_4$ of the memory device $14_2$, the results of logical comparisons $B3_1$ to $B3_4$ of the memory device $14_3$ and the results of logical comparisons $B4_1$ to $B4_4$ of the memory device $14_4$ are stored in the fail memories $25_1$, $25_2$, $25_3$ and $25_4$, respectively. That is, the results of logical comparisons of the memory devices $14_1$ to $14_4$ are stored individually in the fail memories $25_1$ to $25_4$.

Setting the select signals a1, b1, a2 and b2 to 0, a3, b3, a4 and b4 to arbitrary values, $S_1$ to 0, $S_2$ to 1, $S_3$ to 0, $S_4$ to 1, the select signal c1 of each of the first multiplexers $18_1$, $18_5$, $18_9$ and $18_{13}$ to 1, the other select signals c2, c3 and c4 to 0, the select signal c1 of each of the second multiplexers $21_1$, $21_5$, $21_9$ and $21_{13}$ to 1 and the other select signals c2, c3 and c4 to 0, the third multiplexer $23_1$ provides the output ORA1 of the first OR circuit $27_1$ and, similarly, the third multiplexers $23_5$, $23_9$ and $23_{13}$ provide the outputs ORA2, ORA3 and ORA4 of the first OR circuits $27_2$, $27_3$ and $27_4$, respectively. The outputs of the third multiplexers $23_1$, $23_5$, $23_9$ and $23_{13}$ are stored in the fail memory $25_1$. Furthermore, the third multiplexer $23_2$ provides the output ORB1 of the second OR circuit $28_1$, the third multiplexers $23_6$, $23_{10}$ and $23_{14}$ provide the outputs ORB2, ORB3 and ORB4 of the second OR circuits $28_2$, $28_3$ and $28_4$, respectively, and the outputs of the third multiplexers $23_2$, $23_6$, $23_{10}$ and $23_{14}$ are stored in the fail memory $25_2$. In this way, the logical sums ORA1, ORA2, ORA3 and ORA4 of the results of logical comparisons $A1_1$ to $A1_4$, $A2_1$ to $A2_4$, $A3_1$ to $A3_4$ and $A4_1$ to $A4_4$ of the memory devices $12_1$, $12_2$, $12_3$ and $12_4$ loaded on the first test head 11A are stored in the fail memory $25_1$. Likewise, the logical sums ORB1, ORB2, ORB3 and ORB4 of the results of logical comparisons $B1_1$ to $B1_4$, $B2_1$ to $B2_4$, $B3_1$ to $B3_4$ and $B4_1$ to $B4_4$ of the memory devices $14_1$, $14_2$, $14_3$ and $14_4$ loaded on the second test head 11B are stored in the fail memory $25_2$. Thus, the results of logical comparisons of the memory devices on the first and second test heads 11A and 11B can be stored in the fail memories $25_1$ and $25_2$ concurrently. In this instance, only the OR of the results of logical comparisons corresponding to the first to fourth output pins of each memory device can be known, that is, the results of logical comparisons for each pin are not stored in the fail memory. However, in the case of a memory device in which a plural-bit word is accessed by one address, i.e. in a memory device of a 4-bit word configuration, it is necessary only to check the memory device for an error for each word (or address); there is no need of making a check for an error for each bit (or pin).

The above embodiment has been described to include two test heads, but the number of test heads is not limited specifically thereto but may be one or more than two. While the above embodiment has been described in connection with the case where four memory devices under test are loaded on each test head and each have four output pins, it can also be considered that the memory devices A1 and A2 in FIG. 3, for example, are those into which one memory device having eight output pins has been provisionally divided for test. The same is true of the memory devices A3, A4, B1, B2, B3 and B4. The number of fail memories need not always be four but needs only to be equal to at least the number of test heads used.

As described above, according to the present invention, the results of logical comparisons corresponding to a plurality of pins of each memory device are ORed and the OR is selectable. Hence, the results of logical comparisons corresponding to each pin of a plurality of memory device on each test head can be stored in separate fail memories as in the prior art, besides, by selecting the above-mentioned OR, the results of tests of the memory devices on first and second test heads can be stored in separate fail memories concurrently.

It will be apparent that many modifications and variations may be effected without departing from the scope of the novel concepts of the present invention.

What is claimed is:

1. A semiconductor memory tester comprising:
   test pattern generating means for applying a test pattern to each of a plurality of memory devices installed on a test head and each having a plurality of output pins;
   logical comparator means for logically comparing the output of each of said memory devices with an expected value for each output pin and for outputting the result of the logical comparison;
   a plurality of OR circuits each of which obtains the OR of said results of logical comparisons corresponding to a predetermined plurality of pins of said each memory device;
   a plurality of multiplexer means each of which receives a plurality of said results of logical comparisons for corresponding pins of said memory devices and the OR output of one of said plurality of OR circuits and selectively outputs a desired one of said inputs; and
   fail memory means for storing the outputs of said plurality of multiplexer means.

2. The semiconductor memory tester of claim 1, which further includes: second logical comparator means whereby the output of each of a plurality of second semiconductor memory devices installed on another test head is subjected to a logical comparison with an expected value for each pin and outputs the result of logical comparison; a plurality of second OR circuits each of which obtains the OR of said results of logical comparisons corresponding to a predetermined plurality of pins of said each second memory device; a plurality of second multiplexer means each of which receives a plurality of said results of logical comparisons for corresponding pins of said second memory devices and the OR output of one of said plurality of second OR circuits and selectively outputs a desired one of said inputs; and a plurality of third multiplexer means for selectively outputting the outputs of said first and second multiplexer means; and wherein said fail memory means includes at least two fail memories which are supplied with the outputs of said plurality of third multiplexer means.

3. A semiconductor memory tester comprising:
   pattern generating means for applying a test pattern to N first memory devices installed on a first test head and each having P output pins, both N and P being integers equal to or greater than 2;
   first logical comparator means for logically comparing the output of each of said first memory devices with an expected value for each output pin and for outputting the result of said logical comparison;
   second logical comparator means whereby the output of each of N second memory devices installed on a second test head and supplied with said test pattern is logically compared with an expected value for each output pin and from which the result of said logical comparison is output;
   N first OR circuits each of which receives the results of said logical comparisons from said first logical comparator means and obtains the OR of said results of logical comparisons for a predetermined plurality K of pins of each of said memory devices, K being an integer in the range of $2 \leq K \leq P$;
   N second OR circuits each of which receives the results of said logical comparisons from said second logical comparator means and obtains the OR of said results of logical comparisons for a predetermined K pins of each of said memory devices;
   N first multiplexers provided in association with each of corresponding pins of each of said N first memory devices, each of said N first multiplexers receiving N results of said logical comparisons for the corresponding pins of said N first memory devices and the OR output of one of said N first OR circuits and selectively outputting a desired one of said inputs;

N second multiplexers provided in association with each of corresponding pins of each of said N second memory devices, each of said N second multiplexers receiving N results of said logical comparisons for the corresponding pins of said N second memory devices and the OR output of one of said N second OR circuits and selectively outputting a desired one of said inputs;

a plurality of third multiplexers each of which is supplied with at least two corresponding outputs of said first and second multiplexers and selectively outputs either one of said inputs; and at least two fail memories to which the outputs of said third multiplexers are distributed.

* * * * *